US012122904B2

(12) United States Patent
Fan et al.

(10) Patent No.: US 12,122,904 B2
(45) Date of Patent: Oct. 22, 2024

(54) THERMOSETTING RESIN COMPOSITION AND PREPREG, LAMINATE AND PRINTED CIRCUIT BOARD USING SAME

(71) Applicant: SHENGYI TECHNOLOGY CO., LTD., Guangdong (CN)

(72) Inventors: Huayong Fan, Guangdong (CN); Zengbiao Huang, Guangdong (CN); Yongjing Xu, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 257 days.

(21) Appl. No.: 17/789,005

(22) PCT Filed: Mar. 31, 2020

(86) PCT No.: PCT/CN2020/082467
§ 371 (c)(1),
(2) Date: Jun. 24, 2022

(87) PCT Pub. No.: WO2021/134951
PCT Pub. Date: Jul. 8, 2021

(65) Prior Publication Data
US 2023/0045848 A1 Feb. 16, 2023

(30) Foreign Application Priority Data
Dec. 31, 2019 (CN) .......................... 201911410370.1

(51) Int. Cl.
C08L 47/00 (2006.01)
B32B 15/20 (2006.01)
C08J 5/04 (2006.01)
B32B 5/02 (2006.01)
B32B 5/26 (2006.01)
B32B 15/14 (2006.01)

(52) U.S. Cl.
CPC .............. C08L 47/00 (2013.01); B32B 15/20 (2013.01); C08J 5/043 (2013.01); B32B 5/022 (2013.01); B32B 5/024 (2013.01); B32B 5/26 (2013.01); B32B 15/14 (2013.01); B32B 2255/06 (2013.01); B32B 2255/26 (2013.01); B32B 2260/023 (2013.01); B32B 2260/046 (2013.01); B32B 2262/101 (2013.01); B32B 2307/204 (2013.01); B32B 2307/3065 (2013.01); B32B 2307/7265 (2013.01); B32B 2307/748 (2013.01); B32B 2457/08 (2013.01); C08J 2345/00 (2013.01); C08J 2347/00 (2013.01); C08J 2445/00 (2013.01); C08J 2447/00 (2013.01); C08J 2471/12 (2013.01); C08L 2201/08 (2013.01); C08L 2203/16 (2013.01); C08L 2203/20 (2013.01); C08L 2205/025 (2013.01); C08L 2205/03 (2013.01)

(58) Field of Classification Search
CPC .. C08L 47/00; C08L 2201/08; C08L 2203/16; C08L 2203/20; C08L 2205/025; C08L 2205/03; B32B 15/20; B32B 5/26; B32B 15/14; B32B 2255/06; B32B 2255/26; B32B 2260/023; B32B 2260/046; B32B 2262/101; B32B 2307/204; B32B 2307/3065; B32B 2307/7265; B32B 2307/748; B32B 2457/08; C08J 5/043; C08J 2345/00; C08J 2347/00; C08J 2445/00; C08J 2447/00; C08J 2471/12
See application file for complete search history.

(56) References Cited

U.S. PATENT DOCUMENTS

| 4,314,002 A * | 2/1982 | Oizumi ................ H05K 1/0366 428/458 |
| 6,265,506 B1 | 7/2001 | Goodall et al. |
| 2016/0122469 A1* | 5/2016 | Yu ........................... C07C 67/08 528/298 |

FOREIGN PATENT DOCUMENTS

| CN | 1228410 A | 9/1999 |
| CN | 1554680 A | 12/2004 |
| CN | 1555387 A | 12/2004 |
| CN | 103159914 A | 6/2013 |

(Continued)

OTHER PUBLICATIONS

[NPL-1] Iwai et al. (JP 2015-050269 A); Mar. 16, 2015 (EPO—machine translation to English). (Year: 2015).*

(Continued)

Primary Examiner — David Sample
Assistant Examiner — Donald M Flores, Jr.
(74) Attorney, Agent, or Firm — McDonald Hopkins LLC

(57) ABSTRACT

Provided are a thermosetting resin composition and a prepreg, laminate and printed circuit board using same. The thermosetting resin composition comprises a resin component, the resin component comprising a modified cyclic olefin copolymer having a structure as shown in formula I and another unsaturated resin. By introducing a methacrylate end group having a certain polarity into a cyclic olefin copolymer, a modified cyclic olefin copolymer is formed. The modified cyclic olefin copolymer can form a thermosetting material by means of cross-linking with itself or another unsaturated resin, whereby the bonding property can be significantly improved while retaining the excellent dielectric properties of the cyclic olefin copolymer itself. The laminate prepared using the thermosetting resin composition has good dielectric properties, a good peel strength and a good heat resistance, and can meet all the performance requirements for printed circuit board substrates in the current high-frequency and high-speed communication field.

19 Claims, No Drawings

(56) References Cited

FOREIGN PATENT DOCUMENTS

| | | | |
|---|---|---|---|
| CN | 103225453 A | 7/2013 | |
| CN | 104086933 A | 10/2014 | |
| CN | 104379553 A | 2/2015 | |
| CN | 104672888 A | 6/2015 | |
| CN | 104845363 A | 8/2015 | |
| CN | 105884971 A | 8/2016 | |
| CN | 105974734 A | 9/2016 | |
| CN | 106810820 A | 6/2017 | |
| CN | 107216444 A | 9/2017 | |
| JP | 2003331651 A | 11/2003 | |
| JP | 2004085781 A | 3/2004 | |
| JP | 2015050269 A * | 3/2015 | ............ B32B 27/06 |
| KR | 20070072738 A | 7/2007 | |
| WO | 2011108744 A1 | 9/2011 | |
| WO | 2013022263 A2 | 2/2013 | |
| WO | 2015079978 A1 | 6/2015 | |
| WO | 2015120653 A1 | 8/2015 | |

OTHER PUBLICATIONS

International Search Report mailed Oct. 13, 2020; International Patent Application No. PCT/CN2020/082467, filed on Mar. 31, 2020. ISA/CN.

Yao et al., "The Latest Progress for Preparation of Polar Cyclic Olefin Copolymers," China Academic Journal Electronic Publishing House. China. (2010).

* cited by examiner

THERMOSETTING RESIN COMPOSITION AND PREPREG, LAMINATE AND PRINTED CIRCUIT BOARD USING SAME

CROSS-REFERENCE TO RELATED APPLICATIONS

This application is a U.S. National Stage Application, filed under 35 U.S.C. 371 of International Patent Application No. PCT/CN2020/082467 filed Mar. 31, 2020, which claims priority to Chinese Patent Application No. 201911410370.1 with the China National Intellectual Property Administration (CNIPA) on Dec. 31, 2019, the disclosures of each of which are incorporated herein by reference in their entireties.

TECHNICAL FIELD

The present application belongs to the technical field of printed circuit boards, and relates to a thermosetting resin composition, and a prepreg, a laminate and a printed circuit board using the same.

BACKGROUND

With the advent of the 5G era, the demand for high-performance electronic devices has increased currently, and a higher frequency is required in fields of using semiconductor substrates and printed circuit boards. Since the transmission loss and dielectric loss of an electrical signal are proportional to frequency in the high frequency region, the transmission loss increases in the higher-frequency region, which adversely affects the performance, durability and productivity of electronic devices. Therefore, there is a need to develop materials with characteristics of low dielectric constant and low dielectric dissipation factor to reduce these defects.

In the conventional communication and networking field, polyphenylene ether and polyolefin resins are used as low dielectric materials. However, the polyphenylene ether prepreg is fragile, which brings operability problems, and the dielectric dissipation factor cannot be controlled low enough: the polyolefin resin also has some deficiencies, and for example, due to that the curing degree is affected by the position of C=C double bonds, there is a thermal-oxidative aging problem caused by insufficient curing, which will be the most fatal weakness in the field of high-frequency communication in the future. Therefore, there is still a need to develop materials with low dielectric constant, low dielectric dissipation, and few residual carbon-carbon double bonds while having adequate mechanical properties.

Cycloolefin copolymers, abbreviated as COCs (Cyclic-Olefin Copolymers), are new products prepared by copolymerization of cyclic monomers and non-cycloolefin monomers. Generally and more specifically, COC can refer to ethylene-norbornene copolymers. COC has a skeleton structure including a cycloolefin monomer structure, and compared with polypropylene and polyethylene, belongs to a new type of amorphous high-transparency polymer. The typical cycloolefin copolymer materials have higher modulus than high density polyethylene and polypropylene, moisture-proof, low water absorption, high transparency, high glass transition temperature and high chemical resistance, thus attracting much attention.

At present, as a high-performance plastic, COC is mainly applied to the mass manufacture of optical components, packaging materials, electronic components, medical equipment and the like by using its optical performance. CN 103159914A discloses a cycloolefin polymer, which is mainly applied to the manufacture of optical components, packaging materials, electronic components, medical equipment and the like by using the high transmittance, high refractive index, high mechanical strength and other performance of the polymer. CN 104086933A discloses a COC bottle and a preparation method thereof, in which COC is used for the preparation of plastic bottles. In CN 105884971A, by adjusting the content of cycloolefin structural units in a linear olefin-cycloolefin copolymer, and ensuring that the copolymer contains a two-unit group formed by directly bonding two cycloolefin structural units, the obtained copolymer exhibits good performance in terms of tensile strength, breaking elongation, processing properties and the like. The linear olefin-cycloolefin copolymer and the polymer composition are applied to the manufacture of optical components, packaging materials, electronic components, medical equipment and the like. CN 104672888A provides a polyamide molding material including a cycloolefin copolymer, that is, a molding material prepared from an amorphous polyamide (as a main part)+a cycloolefin copolymer+an additive, which also utilizes good optical performance of the cycloolefin copolymer (that is, high transmittance and low haze) for application in optical components. CN 107216444A provides a transparent, high heat-resistant cycloolefin copolymer and a preparation method thereof, and the cycloolefin copolymer is mainly applied to the manufacture of various materials used in optics, information, electric appliances, medical materials and the like.

At present, the development of COC is mainly to use its high transmittance, high refractive index, high mechanical strength and other performance to apply it to the manufacture of optical components, packaging materials, electronic components, medical equipment, etc. There is no report on the use of COC in the field of printed circuit boards so far.

SUMMARY

In view of the deficiencies in the prior art, an object of the present application is to provide a thermosetting resin composition, and a prepreg, a laminate and a printed circuit board using the same. The laminate prepared by using the thermosetting resin composition has good dielectric properties, peel strength and heat resistance, and can satisfy various performance requirements for printed circuit board substrates in the current high-frequency and high-speed communication field.

In order to achieve the object, the present application uses the technical solutions described below.

In a first aspect, the present application provides a thermosetting resin composition, and the thermosetting resin composition includes a resin component, in which the resin component includes a modified cycloolefin copolymer having a structure as shown in formula I, and other unsaturated resins;

formula I

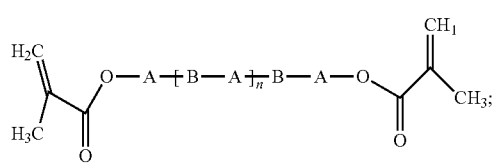

in which, A is selected from one or at least two of

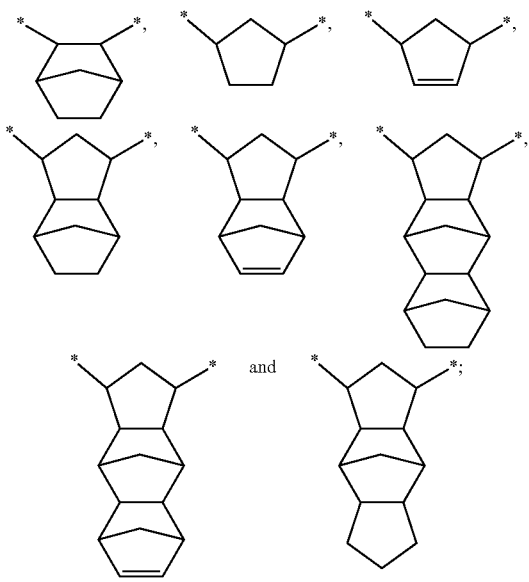

B is selected from one or at least two of

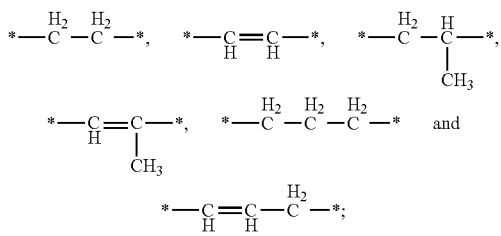

n is an integer of 0-100, and * represents a linkage site of the group.

Through research, the inventors found that the cycloolefin copolymer (COC) has very excellent dielectric properties and heat resistance. For pure COC, $D_k$ (10 GHz) is around 2.35, $D_f$(10 GHz) is around 0.0004, $T_g$ (differential scanning calorimetry, DSC) is around 170° C., and a 5% weight loss temperature is more than or equal to 430° C.: a combination of COC+filler is used to impregnate the ordinary 2116 cloth, and 4 prepregs are pressed into a laminate, of which the performance achieves: $D_k$ (10 GHZ): 3.5, $D_f$ (10 GHz): 0.0020, $T_g$ (DSC): 175° C., and a 5% weight loss temperature: more than or equal to 430° C. It can be seen that COC has excellent dielectric properties and heat resistance, which is expected to be used in the field of copper clad laminates. However, the ordinary COC has very poor peel strength and cannot be directly used in copper clad laminates.

In the present application, the "other unsaturated resins" refers to an unsaturated resin except the modified cycloolefin copolymer with the structure as shown in formula I.

In the present application, a modified cycloolefin copolymer is formed by introducing a methacrylate end group with some polarity into a cycloolefin copolymer, and the modified cycloolefin copolymer can be cross-linked with itself or other unsaturated resins to form a thermosetting material, which significantly improves the bonding performance while maintaining the intrinsic excellent dielectric properties of the cycloolefin copolymer. The modified cycloolefin copolymer can be used as a resin component of a thermosetting resin composition in combination with other unsaturated resins, ensuring that the prepared laminate simultaneously has excellent dielectric properties, peel strength and heat resistance.

In formula I, n is an integer of 0-100, such as 0, 1, 2, 3, 5, 6, 8, 10, 12, 15, 18, 20, 22, 25, 28, 30, 35, 40, 45, 50, 55, 60, 65, 70, 75, 80, 85, 90, 95 or 100, etc.

In the present application, the modified cycloolefin copolymer is prepared by performing copolymerization of a monomer of Unit A and a monomer of Unit B, hydrogenation and end-capping. In the method, the monomer of Unit A is selected from norbornene, cyclopentadiene, dicyclopentadiene (DCPD) and tricyclopentadiene (TCPD); the monomer of Unit B is selected from C2-C3 olefin or alkyne. The monomer of Unit A and the monomer of Unit B can be copolymerized by selecting one monomer respectively, or can be copolymerized by selecting and combining a plurality of monomers respectively.

As a preferred technical solution of the present application, n is an integer of 10-80 in formula I.

Preferably, a number average molecular mass of the modified cycloolefin copolymer is 1000-150000, such as 1000, 1200, 1500, 1800, 2000, 2200, 2500, 2800, 3000, 3200, 3500, 3800, 4000, 4200, 4500, 4800, 5000, 6000, 8000, 10000, 20000, 30000, 40000, 50000, 60000, 70000, 80000, 90000, 100000, 110000, 120000, 130000, 140000 or 150000, etc; further preferably, it can be 1500-7000.

It should be noted that the number average molecular mass in the present application is the number average molecular mass measured by the gel permeation chromatography (GB/T 21863-2008, tetrahydrofuran as elution solvent).

In the present application, the modified cycloolefin copolymer needs to have a suitable molecular weight to ensure that the thermosetting resin composition has good wettability, reactivity and an appropriate content of methacrylate end groups, thereby ensuring that the laminate has low dielectric constant and dielectric dissipation, and high glass transition temperature and peel strength. If the modified cycloolefin copolymer has a too large molecular weight, its wettability will be poor, the reactivity will be low, and the peel strength of the prepared laminate will be insufficient: if the molecular weight of the modified cycloolefin copolymer is too small, the content of methacrylate end groups will be too high, which will easily lead to the laminates having poor dielectric properties and heat resistance.

Preferably, in Unit A and Unit B of the modified cycloolefin copolymer, a number of units containing carbon-carbon double bonds accounts for 10-70% of a total number of Unit A and Unit B, such as 10%, 12%, 15%, 18%, 20%, 22%, 25%, 28%, 30%, 32%, 35%, 38%, 40%, 45%, 50%, 55%, 60%, 65% or 70%: further preferably, it can account for 10-30%.

In the present application, carbon-carbon double bonds with a certain content are preferably retained on the main chain of the modified cycloolefin copolymer, facilitating to subsequent cross-linking and curing. When the carbon-carbon double bond content is too low; which means that the methacrylate end group is solely relied on for cross-linking, it will easily lead to an insufficient cross-linking degree, and low glass transition temperature and peel strength of the laminate: if the carbon-carbon double bond content is too high, it will easily lead to an excessive cross-linking density of the prepared laminate, and the laminate will be too hard and difficult to process. Additionally, if the cross-linking density is too high, some C═C double bonds will be cross-linked incompletely and remain inside the laminate, finally resulting in poor thermal-oxidative aging performance of the laminate.

In the present application, the thermosetting resin composition includes a resin component, and the resin component includes a modified cycloolefin copolymer, and other unsaturated resins. An amount of the modified cycloolefin copolymer and other unsaturated resins in the resin component is not limited, and the amount can be adjusted as required. The modified cycloolefin copolymer can be used as the main resin, and a certain amount of other unsaturated resins can be added, so as to obtain high-frequency substrates with excellent performance in terms of $D_k$, heat resistance and glass strength: other unsaturated resins can also be used as the main resin in the resin component, and adding a certain amount of the modified cycloolefin copolymer can significantly improve the bonding performance of the resin system while maintaining the dielectric properties.

As a preferred technical solution of the present application, the resin component includes 5-30 wt % of the modified cycloolefin copolymer with the structure as shown in formula I (such as 5 wt %, 8 wt %, 10 wt %, 12 wt %, 15 wt %, 18 wt %, 20 wt %, 22 wt %, 25 wt %, 28 wt % or 30 wt %, etc) and 70-95 wt % of other unsaturated resins (such as 70 wt %, 72 wt %, 75 wt %, 78 wt %%, 80 wt %, 82 wt %, 85 wt %, 88 wt %, 90 wt %, 92 wt % or 95 wt %, etc), which means that in the present application, the thermosetting resin composition includes a resin component, and the resin component includes 5-30 wt % of the modified cycloolefin copolymer, and 70-95 wt % of other unsaturated resins. Within this range, the dielectric properties of other unsaturated resin systems can be maintained, and the bonding performance of the resin system can be significantly improved. When the content of the modified cycloolefin copolymer in the resin component is greater than 30 wt %, there will be excessive polar methyl methacrylate groups introduced, which will reduce the dielectric properties of the laminate and also reduce the $T_g$ of the laminate. When the content of the modified cycloolefin copolymer is less than 5 wt %, there will be too few polar groups introduced, which cannot achieve the effect of improving the peel strength.

Preferably, the other unsaturated resins are selected from one or a combination of at least two of an unmodified unsaturated cycloolefin copolymer, a polyphenylene ether resin containing double bonds as an end group, a modified or unmodified polybutadiene resin, a modified or unmodified polyisoprene resin, a bismaleimide resin, a cyanate resin, an allyl-modified benzoxazine resin, triallyl isocyanurate and triallyl cyanurate. For example, the resin component includes 5-30 wt % of a modified cycloolefin copolymer, and 70-95 wt % of an unmodified unsaturated cycloolefin copolymer: or the resin component includes 5-30 wt % of a modified cycloolefin copolymer, and 70-95 wt % of a polyphenylene ether resin containing double bonds as an end group: or the resin component includes 5-30 wt % of a modified cycloolefin copolymer, and 70-95 wt % of a modified or unmodified polybutadiene resin: or the resin component includes 5-30 wt % of a modified cycloolefin copolymer, 70-95 wt % of a modified or unmodified polybutadiene resin and a polyphenylene ether resin containing double bonds as an end group: or the resin component includes 5-30 wt % of a modified cycloolefin copolymer, 70-95 wt % of a modified or unmodified polybutadiene resin, a polyphenylene ether resin containing double bonds as an end group, and a triallyl isocyanurate, etc.

Preferably, the other unsaturated resins include an unmodified unsaturated cycloolefin copolymer which accounts for 40-70% (such as 40%, 42%, 45%, 48%, 50%, 52%, 55%, 58%, 60%, 62%, 65%, 68% or 70%, etc) of a mass of the resin component. For example, in the present application, the resin component includes 5-30 wt % of a modified cycloolefin copolymer, 40-70 wt % of an unmodified unsaturated cycloolefin copolymer, and the remaining amount of a polyphenylene ether containing double bonds as an end group: or the resin component includes 5-30 wt % of a modified cycloolefin copolymer, 40-70 wt % of an unmodified unsaturated cycloolefin copolymer, and the remaining amount of a modified or unmodified polybutadiene resin: or the resin component includes 5-30 wt % of a modified cycloolefin copolymer, 40-70 wt % of an unmodified unsaturated cycloolefin copolymer, and the remaining amount of a bismaleimide resin: or the resin component includes 5-30 wt % of a modified cycloolefin copolymer, 40-70 wt % of an unmodified unsaturated cycloolefin copolymer, and the remaining amount of a modified or unmodified polybutadiene resin and a polyphenylene ether containing double bonds as an end group, etc.

Since the cycloolefin copolymer has excellent dielectric properties, the resin component in the present application preferably includes 5-30 wt % of a modified cycloolefin copolymer and 40-70 wt % of an unmodified unsaturated cycloolefin copolymer, thereby ensuring that the prepared laminate has both good dielectric properties and high peel strength at the same time.

It should be noted that the "unmodified unsaturated cycloolefin copolymer" in the present application refers to an unsaturated cycloolefin copolymer which is not modified with a methacrylate end group.

Optionally, the polybutadiene resin can include a polybutadiene homopolymer or copolymer resin. The polybutadiene copolymer resin can be a polybutadiene-styrene copolymer resin.

The modified polybutadiene resin can be selected from one or more of a hydroxyl-terminated polybutadiene resin, a methacrylate-terminated polybutadiene resin and a carboxylated polybutadiene resin.

Optionally, the polyisoprene resin can include a polyisoprene homopolymer or copolymer resin. The polyisoprene copolymer resin can be a polyisoprene-styrene copolymer resin. The modified polyisoprene resin can be a carboxylated polyisoprene resin.

Specifically, the polybutadiene resin and the polyisoprene resin include a homopolymer and a copolymer containing units derived from butadiene, isoprene, or a mixture thereof. Units derived from other copolymerizable monomer can also be present in the resin, for example, optionally in a grafted form. Exemplarily, the copolymerizable monomers include, but are not limited to, a vinyl aromatic monomer, for example, a substituted and unsubstituted monovinyl aromatic monomer, such as styrene, 3-methylstyrene, 3,5-diethylstyrene, 4-n-propylstyrene, α-methylstyrene, α-methylethenyl toluene, p-hydroxystyrene, p-methoxystyrene, α-chlorostyrene, α-bromostyrene, dichlorostyrene, dibromostyrene and tetrachlorostyrene; and a substituted and unsubstituted divinyl aromatic monomer, such as divinylbenzene and divinyltoluene. A composition including at least one of the above-mentioned copolymerizable monomer can also be used. Exemplarily, the polybutadiene resin includes, but is not limited to, a butadiene homopolymer, and a butadiene-vinyl aromatic copolymer (such as butadiene-styrene): the polyisoprene resin includes but is not limited to an isoprene homopolymer, and an isoprene-vinyl aromatic copolymer (such as an isoprene-styrene copolymer). Exemplarily, a styrene-butadiene copolymer Ricon100 from Crayvally, or a polybutadiene B-1000, B-2000, B-3000 and the like from Nippon Soda can be selected.

Optionally, the polybutadiene resin and the polyisoprene resin can be modified, and for example, the resin can be hydroxyl-terminated, methacrylate-terminated, carboxylate-terminated, etc. The polybutadiene resin and the polyisoprene resin can be a butadiene or isoprene resin modified by epoxy; maleic anhydride, or urethane. The polybutadiene resin and the polyisoprene resin can also be cross-linked, and for example, be cross-linked through a divinyl aromatic compound (such as divinylbenzene), such as poly butadiene-styrene cross-linked with divinylbenzene. The exemplary resin is classified as "poly butadiene" in broad terms by its manufacturers such as Nippon Soda Co. (Tokyo, Japan) and Cray Valley Hydrocarbon Specialty Chemicals (Exton, Pennsylvania, US). The mixture of resins can also be used, such as a mixture of a polybutadiene homopolymer and a poly(butadiene-isoprene) copolymer. A combination including syndiotactic polybutadiene can also be used.

Optionally, the polybutadiene or the polyisoprene polymer can be carboxyl-functionalized. Functionalization can be accomplished using the following polyfunctional compounds that have (i) carbon-carbon double bonds or carbon-carbon triple bonds and (ii) one or more carboxyl groups in the molecule, including carboxylic acid, anhydride, amide, ester or acid halide. A specific carboxyl group is carboxylic acid or ester. Examples of polyfunctional compounds that can provide carboxylic acid functional group include maleic acid, maleic anhydride, fumaric acid, and citric acid. Particularly, maleic anhydride-added polybutadiene can be used in the thermosetting composition. Suitable maleic anhydride-functionalized poly butadiene polymers are commercially available, for example, from Cray Valley under the trade names RICON130MA8, RICON130MA13, RICON130MA20, RICON131MA5, RICON131MA10, RICON131MA17, RICON131MA20 and RICON156MA17. Suitable maleic anhydride-functionalized polybutadiene-styrene copolymers are commercially available, for example, from Crayvally under the trade name RICON184MA6.

Optionally, the polyphenylene ether resin containing double bonds as an end group can be one or more of a methacrylate-terminated polyarylene ether resin, a vinyl-terminated polyarylene ether resin and an allyl-modified polyphenylene ether resin.

Optionally, the polyphenylene ether resin containing double bonds as an end group has a structure represented by formula (1):

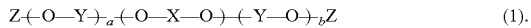

$$Z\text{-}(\text{-}O\text{-}Y\text{-})_a\text{-}(\text{-}O\text{-}X\text{-}O\text{-})\text{-}(\text{-}Y\text{-}O\text{-})_b Z \quad (1).$$

In formula (1), a and b are each independently an integer of 1 to 30,

Z is a group represented by formula (2) or (3):

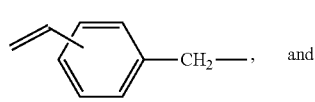

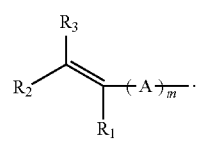

In formula (3), A is an arylene group having 6 to 30 carbon atoms, a carbonyl group, or an alkylene group having 1 to 10 carbon atoms, m is an integer of 0 to 10, and $R_1$ to $R_3$ are each independently a hydrogen atom or an alkyl group having 1 to 10 carbon atoms;

the —(—O—Y—)— in formula (1) is a group represented by formula (4):

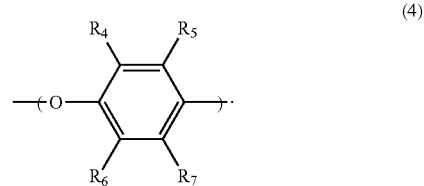

In formula (4), $R_4$ and $R_6$ are each independently a hydrogen atom, a halogen atom, an alkyl group having 1 to 10 carbon atoms or a phenyl group; and $R_5$ and $R_7$ are each independently a hydrogen atom, a halogen atom, an alkyl group having 1 to 10 carbon atoms or a phenyl group:

the —(—O—X—O—)— in formula (1) is a group represented by formula (5):

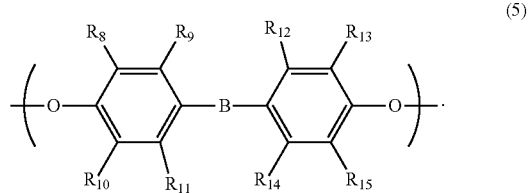

In formula (5), $R_8$, $R_9$, $R_{10}$, $R_{11}$, $R_{12}$, $R_{13}$, $R_{14}$ and $R_{15}$ are each independently a hydrogen atom, a halogen atom, an alkyl group having 1 to 10 carbon atoms or a phenyl group; and B is an arylene group having 6 to 30 carbon atoms, an alkylene group having 1 to 10 carbon atoms, —O—, —CO—, —SO—, —CS— or —SO$_2$—.

The alkyl group having 1 to 10 carbon atoms is preferably an alkyl group having 1 to 8 carbon atoms, more preferably an alkyl group having 1 to 6 carbon atoms, and further preferably an alkyl group having 1 to 4 carbon atoms. Examples of the alkyl group having 1 to 8 carbon atoms can include methyl, ethyl, propyl, butyl, pentyl, hexyl, heptyl, octyl, cyclopropyl, cyclobutyl, cyclopentyl and cyclohexyl. If there exists an isomeric form, all isomeric forms are included. For example, butyl can include n-butyl, isobutyl and tert-butyl.

Examples of the arylene group having 6 to 30 carbon atoms can include a phenylene group, a naphthylene group, and an anthrylene group.

The alkylene group having 1 to 10 carbon atoms is preferably an alkylene group having 1 to 8 carbon atoms, more preferably an alkylene group having 1 to 6 carbon atoms, and further preferably an alkylene group having 1 to 4 carbon atoms. Examples of the alkylene group having 1 to 10 carbon atoms can include a methylene group, an ethylidene group, a propylidene group, a butylidene group, a pentylidene group, a hexylene group, a heptylidene group, an octylidene group, a nonylidene group, a decylene group, a cyclopropylidene group, a cyclobutylidene group, a cyclopentylidene group and a cyclohexylidene group. If there exists an isomeric form, all isomeric forms are included.

Examples of the halogen atom can include a fluorine atom, a chlorine atom, a bromine atom and an iodine atom.

Preferably, a number average molecular mass of the polyphenylene ether resin can be 500 to 10000 g/mol, preferably 800 to 8000 g/mol, further preferably 1000 to 7000 g/mol. Exemplary polyphenylene ether can be methacrylate-modified polyphenylene ether SA9000 from Sabic, or styryl-modified polyphenylene ether St-PPE-1 from Mitsubishi Gas Chemical.

The bismaleimide resin is selected from: DDM-type and DDS-type BMI, and can also be selected from the chain-extended BMI of organosilicone, aliphatic chains or amines.

The cyanate resin is selected from: bisphenol A cyanate, bisphenol E cyanate, bisphenol F cyanate, bisphenol M cyanate, phenolic cyanate (LONZA BA-3000S), dicyclopentadiene cyanate, tetramethyl bisphenol F cyanate, and a bisphenol A cyanate prepolymer.

Preferably, the resin component can also include other saturated resins, such as a saturated cycloolefin copolymer and an epoxy resin.

As a preferred technical solution of the present application, based on that a total part by weight of the thermosetting resin composition is 100 parts, the thermosetting resin composition includes 10-90 parts of a resin component, 0-60 parts of a filler and 5-20 parts of a flame retardant.

In the present application, a part by weight of the resin component can be 10 parts, 12 parts, 15 parts, 18 parts, 20 parts, 22 parts, 25 parts, 28 parts, 30 parts, 32 parts, 35 parts, 38 parts, 40 parts, 42 parts, 45 parts, 48 parts, 50 parts, 52 parts, 55 parts, 58 parts, 60 parts, 62 parts, 65 parts, 68 parts, 70 parts, 72 parts, 75 parts, 78 parts, 80 parts, 82 parts, 85 parts, 88 parts, 90 parts, etc.

A part by weight of the filler can be 0 part, 2 parts, 5 parts, 8 parts, 10 parts, 12 parts, 15 parts, 18 parts, 20 parts, 22 parts, 25 parts, 28 parts, 30 parts, 32 parts, 35 parts, 38 parts, 40 parts, 42 parts, 45 parts, 48 parts, 50 parts, 52 parts, 55 parts, 58 parts, 60 parts, etc.

A part by weight of the flame retardant can be 5 parts, 6 parts, 7 parts, 8 parts, 9 parts, 10 parts, 12 parts, 13 parts, 15 parts, 16 parts, 18 parts, 20 parts, etc.

As a preferred technical solution of the present application, the filler is an inorganic filler and/or an organic filler.

Preferably, the inorganic filler is selected from any one or a mixture of at least two of aluminum hydroxide, boron nitride, aluminum oxide, silicon nitride, aluminum nitride, silicon dioxide, talc, mica, barium sulfate, lithopone, calcium carbonate, wollastonite, kaolin, brucite, diatomite, bentonite and a pumice powder.

Preferably, the organic filler is selected from one or a mixture of at least two of a polyetheretherketone (PEEK) powder, a polytetrafluoroethylene (PTFE) powder or an acrylic resin powder Preferably, a median particle size of the filler is 0.05-30 μm (measured by a Malvern laser particle size analyzer).

Preferably, the flame retardant is selected from a bromine-containing flame retardant or a halogen-free flame retardant.

As a preferred technical solution of the present application, the flame retardant is selected from one or a combination of at least two of a phosphate salt flame retardant (such as OP935), a phosphate flame retardant (such as PX200 and PX202) and a phosphazene flame retardant (such as SPB-100).

Preferably, the thermosetting resin composition further includes 0.1-3 parts of an initiator.

Preferably, the initiator is an azo initiator or a peroxide initiator; for example, the initiator can be benzoyl peroxide (BPO), dicumyl peroxide (DCP), azobisisobutyronitrile, etc.

In a second aspect, the present application provides a prepreg, and the prepreg includes a reinforcing material, and the thermosetting resin composition according to the first aspect which is adhered to the reinforcing material after impregnating and drying.

The present application has no special limitation on the preparation method of the prepreg; exemplarily, the thermosetting resin composition according to the first aspect can be dissolved or dispersed in a solvent, so as to obtain a resin varnish; then the reinforcing material is impregnated with the resin varnish, heated and dried, and then the prepreg is obtained.

In the method, examples of the solvent that can be used are: ketones such as acetone, methyl ethyl ketone and methyl isobutyl ketone: hydrocarbons such as toluene and xylene; alcohols such as methanol, ethanol and primary alcohol; ethers such as ethylene glycol monomethyl ether and propylene glycol monomethyl ether; esters such as propylene glycol methyl ether acetate and ethyl acetate; aprotic solvents such as N,N-dimethylformamide and N,N-diethylformamide. The above-mentioned solvent can be used alone or in combination of two or more. An aromatic hydrocarbon solvent of toluenes is preferably selected. An amount of the solvent can be selected by those skilled in the art based on experience, as long as the obtained resin varnish has a viscosity suitable for use.

The reinforcing material can be an inorganic or organic reinforcing material. Examples of the inorganic reinforcing material are: woven or non-woven fabrics or paper made of glass fiber, carbon fiber, boron fiber, metal, etc. Among them, the glass fiber cloth or non-woven fabric can be E-glass, Q-type cloth, NE cloth, D-type cloth, S-type cloth, high silica cloth, etc. Examples of the organic reinforcing material are: woven or non-woven fabrics or paper made of polyester, polyamine, polyacrylic acid, polyimide, aramid, polytetrafluoroethylene, syndiotactic polystyrene, etc.

A temperature of heating and drying can be 80-250° C., preferably 120-180° C.; such as 80° C., 90° C., 100° C., 110° C., 120° C., 130° C., 140° C., 150° C., 160° C., 170° C., 180° C., 190° C., 200° C., 210° C., 220° C., 230° C., 240° C. or 250° C., etc; a time can be 1-30 min, preferably 1-10 min; such as 1 min, 2 min, 3 min, 5 min, 8 min, 10 min, 12 min, 15 min, 18 min, 20 min, 22 min, 25 min, 28 min or 30 min, etc.

A content of the thermosetting resin composition in the prepreg can be 30-95 wt %, preferably 60-90 wt %; for example, the content can be 30 wt %, 35 wt %, 40 wt %, 45 wt %, 50 wt %, 55 wt %, 60 wt %, 65 wt %, 70 wt %, 75 wt %, 80 wt %, etc.

In a third aspect, the present application provides a resin film, and the resin film is prepared by semi-curing the thermosetting resin composition according to the first aspect by baking and heating.

In a fourth aspect, the present application provides a resin-coated copper foil, and the resin-coated copper foil is prepared by coating the thermosetting resin composition according to the first aspect on a copper foil, and heating the same for a semi-cured state.

In a fifth aspect, the present application provides a laminate, and the laminate includes one or at least two stacked prepregs according to the second aspect.

In a sixth aspect, the present application provides a metal foil clad laminate, and the metal foil clad laminate includes one or at least two stacked prepregs according to the second aspect, and a metal foil covered on one or two sides of the one prepreg or the stacked prepregs.

The present application has no special limitation on a preparation method of the metal foil clad laminate. Exemplarily, the following methods can be used: one or more prepregs are cut into a certain size, stacked and then sended to a lamination equipment for lamination; at the same time, a metal foil is placed on one or two sides of the semi-cured prepregs, and the semi-cured prepregs are subjected to pressing through hot pressing for preparation of the metal foil clad laminate.

In the method, the metal foil can be copper, brass, aluminum, nickel, and alloys or composite metal foils of these metals.

The pressing conditions of the laminate can be selected from: a lamination temperature of 130-250° C. (such as 130° C., 140° C., 150° C., 160° C., 170° C., 180° C., 190° C., 200° C., 210° C., 220° C., 230° C., 240° C. or 250° C., etc), a pressure of 3-50 kgf/cm$^2$ (such as 3 kgf/cm$^2$, 5 kgf/cm$^2$, 10 kgf/cm$^2$, 15 kgf/cm$^2$, 20 kgf/cm$^2$, 25 kgf/cm$^2$, 30 kgf/cm$^2$, 35 kgf/cm$^2$, 40 kgf/cm$^2$, 45 kgf/cm$^2$ or 50 kgf/cm$^2$, etc), a hot pressing time of 60-240 min (such as 60 min, 70 min, 80 min, 90 min, 100 min, 120 min, 150 min, 180 min, 200 min, 220 min or 240 min, etc).

In a seventh aspect, the present application provides a printed circuit board, and the printed circuit board is prepared by removing part of the metal foil on the surface of the metal foil clad laminate according to the sixth aspect to form a circuit.

Compared with the prior art, the present application has the following beneficial effects:

In the present application, a modified cycloolefin copolymer is formed by introducing a methacrylate end group with some polarity into a cycloolefin copolymer, and the modified cycloolefin copolymer can be cross-linked with itself or other unsaturated resins to form a thermosetting material, which significantly improves the bonding performance while maintaining the intrinsic excellent dielectric properties of the cycloolefin copolymer. The modified cycloolefin copolymer can be used as a resin component of a thermosetting resin composition in combination with other unsaturated resins, and the prepared copper clad laminate can be used as a printed circuit board substrate in the high-frequency and high-speed communication field.

DETAILED DESCRIPTION

Technical solutions of the present application are further described below in conjunction with specific embodiments. Those skilled in the art should understand that the embodiments described herein are merely used for a better understanding of the present application and should not be construed as specific limitations on the present application.

Preparation Example 1

A modified norbornene-ethylene copolymer A-1 is provided, and its preparation steps are described below.

Step 1. Synthesis of an ethylene-norbornene copolymer: a 500 mL polymerization reactor dried by heating was subjected to vacuum and purged with nitrogen twice, and then subjected to vacuum again and injected with ethylene; then, 4 mL of a toluene solution of methylaluminoxane (1.5 mmol/mL), 66 mL of toluene with water and oxygen removed and 20 mL of a toluene solution of norbornene (2 mmol/mL) were added sequentially, injected with ethylene of 3 atmospheric pressures to saturation under mechanical stirring and, with 3 atmospheric pressures controlled through adding ethylene, reacted at 40° C. for 2 h under this pressure, and then added with an end-capping reagent of 5-norbornene-2-methanol (CAS: 13080-90-5) and reacted for 2 h.

Step 2. On the basis of Step 1 and with 3 standard atmospheric pressures controlled, hydrogen was injected, and the hydrogenation process was performed for 30 min, controlling a hydrogen amount and an addition time, and ensuring 15% of C=C double bonds remained. After the reaction was completed, the reaction liquid was poured into anhydrous methanol, and a large amount of white polymer was precipitated. The product obtained by filtration was washed with acetone for 3 times, then put into a vacuum oven and dried at 40° C. for 12 hours.

Step 3. the solid prepared in Step 2 was dissolved in a toluene solvent, methacryloyl chloride was slowly added dropwise in an ice bath (−5° C. to 5° C.) condition, and meanwhile, 2 g of triethylamine was added in three separate rounds as an acid binding agent (also as a catalyst), and the addition process of the methacryloyl chloride reagent was controlled at 30 min-60 min. After the addition, the mixture was then reacted for 5 h, the reaction liquid was poured into anhydrous methanol, and a large amount of white polymer was precipitated. The product obtained by filtration was washed with acetone for 3 times, then put into a vacuum oven and dried at 40° C. for 12 hours, so as to obtain a modified COC with methacrylate end groups, which was denoted as A-1.

Using the gel permeation chromatography for detection, it was found that a number average molecular mass $M_n$ was 3150, and a molecular weight distribution index $M_w/M_n$ was 1.85.

Preparation Example 2

A modified TCPD-ethylene copolymer A-2 is provided, and its preparation steps are described below.

Step 1. Synthesis of an ethylene-tricyclopentadiene copolymer: a 500 mL polymerization reactor dried by heating was subjected to vacuum and purged with nitrogen twice, and then subjected to vacuum again and injected with ethylene: then, 4 mL of a toluene solution of methylaluminoxane (1.5 mmol/mL), 66 mL of toluene with anhydrous and anoxic treatment and 20 mL of a toluene solution of tricyclopentadiene (TCPD) (2 mmol/mL) were added sequentially, injected with ethylene of 3 atmospheric pressures to saturation under mechanical stirring and, with 3 standard atmospheric pressures controlled through adding ethylene, reacted at 40° C. for 2 h under this pressure, and then added with an end-capping reagent of 5-norbornene-2-methanol (CAS: 13080-90-5) and reacted for 2 h.

Step 2. On the basis of Step 1 and with 3 standard atmospheric pressures controlled, hydrogen was injected, and the hydrogenation process was performed for 30 min, controlling a hydrogen amount and an addition time, and ensuring 30% of C=C double bonds remained. After the reaction was completed, the reaction liquid was poured into anhydrous methanol, and a large amount of white polymer was precipitated. The product obtained by filtration was washed with acetone for 3 times, then put into a vacuum oven and dried at 40° C. for 12 hours, so as to obtain an unmodified unsaturated cycloolefin copolymer denoted as B-4.

Step 3. the solid prepared in Step 2 was dissolved in a toluene solvent, methacryloyl chloride was slowly added dropwise in an ice bath (−5° C. to 5° C.) condition, and meanwhile, 2 g of triethylamine was added in three separate rounds as an acid binding agent (also as a catalyst), and the addition process of the methacryloyl chloride reagent was controlled at 30 min-60 min. After the addition, the mixture was then reacted for 5 h, the reaction liquid was poured into anhydrous methanol, and a large amount of white polymer was precipitated. The product obtained by filtration was washed with acetone for 3 times, then put into a vacuum oven and dried at 40° C. for 12 hours, so as to obtain a modified COC with methacrylate end groups, which was denoted as A-2.

Through detection, it was found that a number average molecular mass $M_n$ was 6310, and a molecular weight distribution index $M_w/M_n$ was 2.1.

Preparation Example 3

A modified TCPD-ethylene copolymer A-3 is provided, and its preparation method differs from Preparation Example 2 in that hydrogenation was performed in Step (2) until the content of carbon-carbon double bonds was 0.

Types and sources of the raw materials used in the examples below are as follows:
(A) Cycloolefin Copolymer
A-1 Methyl methacrylate-modified norbornene-ethylene copolymer (prepared in Preparation Example 1);
A-2 Methyl methacrylate-modified TCPD-ethylene copolymer (prepared in Preparation Example 2);
A-3 Methyl methacrylate-modified TCPD-ethylene copolymer (prepared in Preparation Example 3);
(B) Other resins
B-1 Allyl-modified polyphenylene ether resin (Product Model PP501, Taiwan Chain Yee);
B-2 Polybutadiene (Product Model Japan Caoda B-3000);
B-3 Styrene-butadiene resin (Product Model Ricon 100);
B-4 Unmodified unsaturated cycloolefin copolymer (an intermediate product of Preparation Example 2

B-5 Saturated cycloolefin copolymer (Product Model TOPAS 6017)
B-6 Epoxy resin (E51 epoxy resin);
(C) Filler: Spherical silica powder (Product Model SFP-30M, Denka Chemical Industry Co., Ltd.);
(D) Flame retardant: Phenoxyphosphazene compound (Product Model SPB-100, Japan Otsuka Chemical Co., Ltd.);
(E) Initiator: Dicumyl peroxide (Shanghai Gaoqiao).

Examples 1-9

Examples 1-9 each provide a copper clad laminate, and its preparation method is described below.

(1) Preparation of a Resin Varnish

Component A of a modified cycloolefin copolymer, Component B of other unsaturated resins except a modified cycloolefin copolymer, Component C of a filler, Component D of a flame retardant, and Component E of an initiator were added in a solvent of toluene with a proportion, and mixed uniformly, so as to obtain a resin varnish with a solid content of 65%.

(2) Preparation of a Prepreg

The 2116 #fiberglass cloth was used as a reinforcing material, impregnated with the prepared resin varnish, baked in an oven at 155° C. for 3 min, and prepared into the prepreg (bonding sheet).

(3) Preparation of a Copper Clad Laminate

The prepreg was cut according to a certain size, and 6 prepregs were neatly stacked, covered with electrolytic copper foils of 35 μm thickness on both sides, and heated and cured in a vacuum press, in which hot pressing conditions for preparing the copper clad laminate included: a temperature of 210° C., a pressure of 25 kg/cm², and a pressing time of 90 min.

Comparative Example 1

A copper clad laminate is provided, which is different from Example 3 in that the modified cycloolefin copolymer A-1 was replaced with an unmodified unsaturated cycloolefin copolymer B-4.

Comparative Example 2

A copper clad laminate is provided, which is different from Example 3 in that the styrene-butadiene resin B-3 was replaced with an epoxy resin B-6.

Comparative Example 3

A copper-clad laminate is provided, which is different from Example 4 in that the unmodified unsaturated cycloolefin copolymer B-4 was replaced with a saturated cycloolefin copolymer B-5.

Types and amount (part by weight) of the raw materials used in Examples 1-9 and Comparative Examples 1-3 and performance data of the obtained copper clad laminates are shown in Table 1 and Table 2 below:

TABLE 1

| Raw material/Performance | Example 1 | Example 2 | Example 3 | Example 4 | Example 5 | Example 6 | Example 7 |
|---|---|---|---|---|---|---|---|
| A-1 | 20 | — | 15 | — | — | 17 | — |
| A-2 | — | 17 | 15 | 15 | 17 | — | 17 |
| A-3 | — | — | — | 15 | — | — | — |
| B-1 | 68 | — | — | — | 17 | — | — |
| B-2 | — | 41 | — | — | — | 11 | — |
| B-3 | — | — | 28 | — | — | — | — |
| B-4 | — | — | — | 28 | — | 30 | 41 |
| B-5 | — | — | — | — | 24 | — | — |
| B-6 | — | — | — | — | — | — | — |
| C | — | 30 | 30 | 30 | 30 | 30 | 30 |
| D | 10 | 10 | 10 | 10 | 10 | 10 | 10 |

TABLE 1-continued

| Raw material/Performance | Example 1 | Example 2 | Example 3 | Example 4 | Example 5 | Example 6 | Example 7 |
|---|---|---|---|---|---|---|---|
| E | 2 | 2 | 2 | 2 | 2 | 2 | 2 |
| Glass transition temperature Tg (DSC)/° C. | 203 | 217 | 214 | 211 | 201 | 221 | 224 |
| Flammability (UL94) | V-0 | V-0 | V-0 | V-0 | V-0 | V-0 | V-0 |
| Thermal delamination time T-288/min | >60 | >60 | >60 | >60 | >60 | >60 | >60 |
| Peel strength (N/mm) | 0.94 | 1.07 | 1.03 | 1.03 | 1.02 | 1.01 | 1.09 |
| Thermal decomposition temperature Td5 % (TGA, ° C.) | 434 | 428 | 421 | 421 | 421 | 422 | 431 |
| Water absorption rate (%) | 0.016 | 0.07 | 0.11 | 0.11 | 0.10 | 0.09 | 0.07 |
| Dielectric constant Dk (SDPR 10 GHz) | 3.51 | 3.58 | 3.61 | 3.65 | 3.61 | 3.61 | 3.50 |
| Dielectric dissipation Df (SDPR 10 GHz) | 0.0025 | 0.0025 | 0.0026 | 0.0025 | 0.022 | 0.0023 | 0.0021 |

TABLE 2

| Raw material/Performance | Example 8 | Example 9 | Comparative Example 1 | Comparative Example 2 | Comparative Example 3 |
|---|---|---|---|---|---|
| A-1 | / | / | / | 15 | / |
| A-2 | 21 | 8 | / | 15 | 15 |
| A-3 | / | / | / | / | 15 |
| B-1 | / | 10 | 68 | / | / |
| B-2 | / | / | / | / | / |
| B-3 | / | / | / | / | / |
| B-4 | 17 | 20 | 20 | / | / |
| B-5 | / | / | / | / | 28 |
| B-6 | / | / | / | 28 | / |
| C | 50 | 50 | / | 30 | 30 |
| D | 10 | 10 | 10 | 10 | 10 |
| E | 2 | 2 | 2 | 2 | 2 |
| Glass transition temperature Tg (DSC)/° C. | 201 | 218 | 211 | 181 | 191 |
| Flammability (UL94) | V-0 | V-0 | V-0 | V-0 | V-0 |
| Thermal delamination time T-288/min | >60 | >60 | >60 | 30 | 45 |
| Peel strength (N/mm) | 1.03 | 0.99 | 0.74 | 1.00 | 0.97 |
| Thermal decomposition temperature Td5% (TGA, ° C.) | 431 | 421 | 411 | 371 | 401 |
| Water absorption rate (%) | 0.018 | 0.21 | 0.14 | 0.35 | 0.17 |
| Dielectric constant Dk (SDPR 10 GHz) | 3.55 | 3.57 | 3.58 | 3.9 | 3.55 |
| Dielectric dissipation Df (SDPR 10 GHz) | 0.0025 | 0.0024 | 0.0027 | 0.0045 | 0.0024 |

Test methods for the above performance are as follows:
(1) Glass transition temperature ($T_g$): measured by using DSC test according to the DSC test method specified in IPC-TM-650 2.4.24;
(2) Flammability: measured according to the flammability method specified in UL94;
(3) Thermal delamination time measured by using a thermomechanical analyzer (TMA) instrument according to the T288 test method specified in IPC-TM-650 2.4.24.1;
(4) Peel strength: measured according to IPC-TM-650 2.4.8 method;
(5) Thermal decomposition temperature ($T_d5\%$): measured by using the thermogravimetric analysis (TGA) test according to the TGA test method specified in IPC-TM-650 2.4.24.6, and taking a temperature corresponding to 5% thermal weight loss as the thermal decomposition temperature;

(6) Water absorption rate: measured according to the water absorption test method specified in IPC-TM-650 2.6.2.1;

(7) Dielectric constant ($D_k$) and dielectric dissipation factor ($D_f$): measured according to the Split Post Dielectric Resonator (SPDR) method:

From the test results in Table 1 and Table 2, it can be seen that the copper clad laminate prepared by using the thermosetting resin composition provided in the present application had the glass transition temperature reaching 201-224° C., the temperature of 421-434° C. corresponding to 5% thermal weight loss, the peel strength reaching 0.92-1.09 N/mm, the thermal delamination time reaching more than or equal to 60 min, the dielectric constant $D_k$ (10 GHz) of 3.50-3.65, the dielectric dissipation factor $D_f$ (10 GHz) of 0.0021-0.0026, and the water absorption rate of 0.016-0.21%, and had good heat resistance, good dielectric properties, high peel strength, low water absorption rate, which was suitable for the high-frequency and high-speed communication field.

Among the examples, compared with Example 1, Comparative Example 1 used the unmodified unsaturated COC to replace the methacrylate-modified COC. Since the unmodified unsaturated COC had no polar group, the copper clad laminate using the same had poor peel strength.

Compared with Example 3, since Comparative Example 2 used the epoxy resin to replace the unsaturated styrene-butadiene resin, the dielectric properties of the prepared copper clad laminate deteriorated sharply, which could not satisfy high-frequency applications.

Compared with Example 4, Comparative Example 3 only used the commercial unmodified cycloolefin copolymer TOPAS 6017 without other unsaturated resins. Since there was no reactive C=C, a three-dimensional cross-linked network could not be formed. Therefore, the copper clad laminate using the copolymer had poor heat resistant properties such as Tg and solder dipping resistance.

The applicant has stated that although the specific embodiments of the present application is described above, the protection scope of the present application is not limited to the embodiments, and it should be apparent to those skilled in the art that variations or replacements, which are obvious for those skilled in the art without departing from the technical scope disclosed in the present application, all fall within the protection scope and the disclosure scope of the present application.

What is claimed is:

1. A thermosetting resin composition, comprising a resin component, wherein the resin component comprises a modified cycloolefin copolymer having a structure as shown in formula I, and other unsaturated resins;

formula I

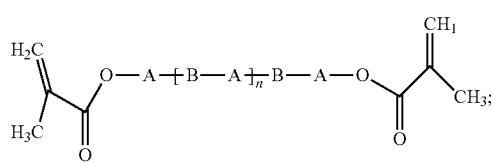

wherein Unit A is selected from one or at least two of

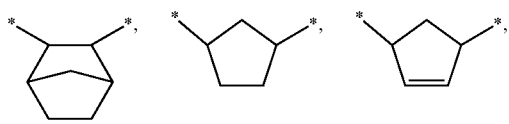

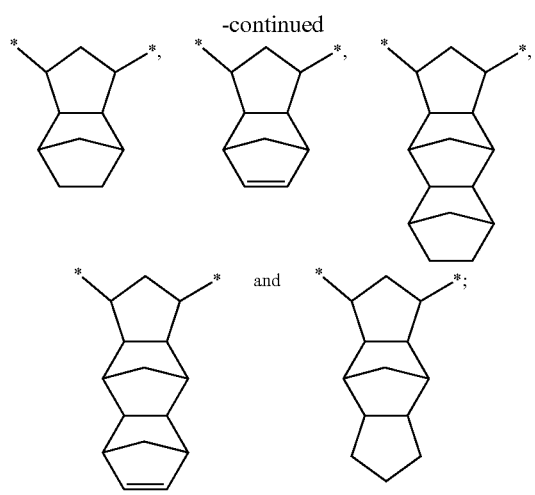

Unit B is selected from one or at least two of

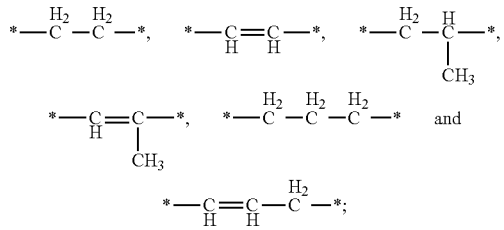

n is an integer of 0-100, and * represents a linkage site of the group;

wherein in Unit A and Unit B of the modified cycloolefin copolymer, a number of units containing carbon-carbon double bonds accounts for 10-70% of a total number of Unit A and Unit B.

2. The thermosetting resin composition according to claim 1, wherein n is an integer of 10-80 in formula I.

3. The thermosetting resin composition according to claim 1, wherein the resin component comprises 5-30 wt % of the modified cycloolefin copolymer having the structure as shown in formula I and 70-95 wt % of other unsaturated resins.

4. The thermosetting resin composition according to claim 1, wherein based on that a total part by weight of the thermosetting resin composition is 100 parts, the thermosetting resin composition comprises 10-90 parts of the resin component, 0-60 parts of a filler and 5-20 parts of a flame retardant.

5. The thermosetting resin composition according to claim 4, wherein the filler is an inorganic filler and/or an organic filler.

6. The thermosetting resin composition according to claim 4, wherein the flame retardant is selected from a bromine-containing flame retardant or a halogen-free flame retardant.

7. The thermosetting resin composition according to claim 6, wherein the halogen-free flame retardant is selected from one or a combination of at least two of a phosphate salt flame retardant, a phosphate flame retardant and a phosphazene flame retardant.

8. A prepreg, comprising a reinforcing material, and the thermosetting resin composition according to claim 1 which is adhered to the reinforcing material after impregnating and drying.

9. A laminate, comprising one or at least two stacked prepregs according to claim 8.

10. A metal foil clad laminate, comprising one or at least two stacked prepregs according to claim 8, and a metal foil covered on one or two sides of the one prepreg or the stacked prepregs.

11. A printed circuit board, which is prepared by removing part of the metal foil on the surface of the metal foil clad laminate according to claim 10 to form a circuit.

12. A resin film, which is prepared by semi-curing the thermosetting resin composition according to claim 1 by baking and heating.

13. A resin-coated copper foil, which is prepared by coating the thermosetting resin composition according to claim 1 on a copper foil, and heating the same for a semi-cured state.

14. The thermosetting resin composition according to claim 1, wherein a number average molecular mass of the modified cycloolefin copolymer is 1000-150000 g/mol.

15. The thermosetting resin composition according to claim 1, wherein the other unsaturated resins are selected from one or a combination of at least two of an unmodified unsaturated cycloolefin copolymer, a polyphenylene ether resin containing double bonds as an end group, a modified or unmodified polybutadiene resin, a modified or unmodified polyisoprene resin, a bismaleimide resin, a cyanate resin, an allyl-modified benzoxazine resin, triallyl isocyanurate and triallyl cyanurate.

16. The thermosetting resin composition according to claim 1, wherein the other unsaturated resins comprise an unmodified unsaturated cycloolefin copolymer which accounts for 40-70% of a mass of the resin component.

17. The thermosetting resin composition according to claim 1, wherein the resin component further comprises a saturated resin.

18. The thermosetting resin composition according to claim 1, wherein the thermosetting resin composition further comprises 0.1-3 parts of an initiator based on that a total part by weight of the thermosetting resin composition is 100 parts.

19. The thermosetting resin composition according to claim 18, wherein the initiator is an azo initiator or a peroxide initiator.

* * * * *